United States Patent [19]

Corda et al.

[11] Patent Number: 4,792,925
[45] Date of Patent: Dec. 20, 1988

[54] EPROM MEMORY MATRIX WITH SYMMETRICAL ELEMENTARY MOS CELLS AND WRITING METHOD THEREFOR

[75] Inventors: Giuseppe Corda, Saronno; Andrea Ravaglia, Monza, both of Italy

[73] Assignee: SGS Microelettronica S.p.A., Catania, Italy

[21] Appl. No.: 783,650

[22] Filed: Oct. 3, 1985

[30] Foreign Application Priority Data

Nov. 7, 1984 [IT] Italy ............................... 23479 A/84

[51] Int. Cl.⁴ ............................................ G11C 11/40
[52] U.S. Cl. .................................................... 365/185
[58] Field of Search ................... 365/51, 185; 357/23.5

[56] References Cited

U.S. PATENT DOCUMENTS

| | | | |
|---|---|---|---|
| 4,282,446 | 8/1981 | McElroy | 365/185 |
| 4,451,904 | 5/1984 | Sugiura et al. | 365/185 |
| 4,472,792 | 9/1984 | Shimohigashi et al. | 365/189 |
| 4,594,689 | 6/1986 | Donoghue | 365/182 |

Primary Examiner—James W. Moffitt
Attorney, Agent, or Firm—Cushman, Darby & Cushman

[57] ABSTRACT

The invention provides an EPROM memory matrix and a method of writing to an EPROM memory matrix. Two pluralities of parallel source lines alternate with parallel drain lines while floating gate areas span the source and drain lines and parallel control gate lines are arranged perpendicularly to the source and drain lines and superimposed on and self-aligned with the floating gate areas. During the writing operation, the gate and drain lines corresponding to a selected cell are connected to a positive voltage source and the source line corresponding to the selected cell is connected to earth together with all the other source lines of the same plurality while all the source lines of the other plurality are left at a potential intermediate between said positive voltage and earth.

4 Claims, 2 Drawing Sheets

EPROM MEMORY MATRIX WITH SYMMETRICAL ELEMENTARY MOS CELLS AND WRITING METHOD THEREFOR

BACKGROUND OF THE INVENTION

The present invention relates to an EPROM memory matrix made up of symmetrical elementary MOS cells as well as a writing method for said memory.

Conventional EPROM (Electrically Programmable Read-Only Memory) memories made with symmetrical elementary MOS (Metal Oxide Semiconductor) cells are known to call for the constitution of pairs of control gate lines superimposed on and self-aligned with floating gate areas spaced by parallel source lines connected to earth while drain contacts are interposed between one gate line and the next of each pair and connected electrically to metallization lines perpendicular to the gate and source lines. Field oxide areas are formed between the gate lines and an underlying silicon substrate to mutually insulate the elementary cells of the matrix.

The limitation of the memory made with this technology is dimensional, i.e. it is not possible to fall below certain minimal dimensions, primarily because of the tolerances between the gate lines and source lines, the distances between the gate lines and the drain contacts, and the side dimensions of the individual cells.

SUMMARY OF THE INVENTION

The object of the present invention is to achieve an EPROM memory matrix structure with symmetrical elementary MOS cells, which is less affected by size limits and reaches reduced overall size and greater assembly compactness. According to the invention, this object is achieved by an EPROM memory matrix structure with symmetrical elementary MOS cells characterized in that it comprises on a silicon substrate two pluralities of parallel source lines alternating with parallel drain lines, the source lines of each plurality being electrically connected together, floating gate areas spanning said source lines and drain lines, and parallel lines of control gates developed perpendicularly to said source and drain lines and superimposed on and self-aligned with said floating gate areas.

Said memory structure solves the dimensional problems of conventional memories while reaching limits of miniaturization, cell density and compactness of great interest. Just to provide an idea, with a 1.5$\mu$ technology the area to be assigned to each memory cell according to the invention is 9$\mu^2$ as compared with 36$\mu^2$ for conventional memories.

It should be considered that the memory according to the invention due to the conformation described above does not require critical alignments, has no interposed drain contacts, does not require field oxide for insulation between the various cells and, as it provides a dual plurality of source lines, has a drain space such as to facilitate arrangement of the decoding circuits to be associated with the memory.

To write or program a selected cell of the memory according to the invention a writing method has been conceived in accordance with the invention which calls for connecting to a positive voltage source the gate and drain lines of the selected cell and connecting to ground the source line of said selected cell and all the other source lines of the same plurality of source lines while all the source lines of the other plurality are left floating.

In this manner not only are excluded from writing all the cells with gate lines different from the one connected to the positive voltage source but also those associated with the same gate line and interposed between the drain line connected to the positive voltage source and the source line of the plurality connected to ground, which is subsequent to the one corresponding to the selected cell. Said interposed cells, three in number, are connected in series between said source lines connected to ground and said positive voltage drain line with the result that they are traversed by a current too weak to bring about writing thereof. Thus is assured correct writing of only the selected cell.

A residual problem of the memory according to the invention could be the high resistivity of the source and drain lines, which will consist basically of N+ diffusions in the silicon substrate. According to the invention this problem is solved by electrically connecting together the source lines of each plurality by means of pairs of metallization lines arranged parallel to the gate lines in predetermined spaces between adjacent gate lines and also short-circuiting the drain lines with other metallization lines developing on the drain lines between one of said spaces and the next. In this manner the source and drain lines are connected at predetermined intervals to a common potential which ensures minimal potential differences at the points furthest from the contacts with the metallization lines.

The solution to said problems creates however another problem, i.e. the making of the metallization contacts. A preferred solution from the dimensional and functional viewpoints is at present self-alignment of the metallization contacts with the source and drain lines and the metallization lines themselves. In this manner the area lost for the contacts is smaller and the number of gate lines for a given useful area of the matrix is correspondingly greater.

This and other characteristics of the present invention will be made clear by the following detailed description of a practical embodiment thereof illustrated as an example in the annexed drawings wherein:

DESCRIPTION OF THE PREFERRED EMBODIMENT

Figure 1:
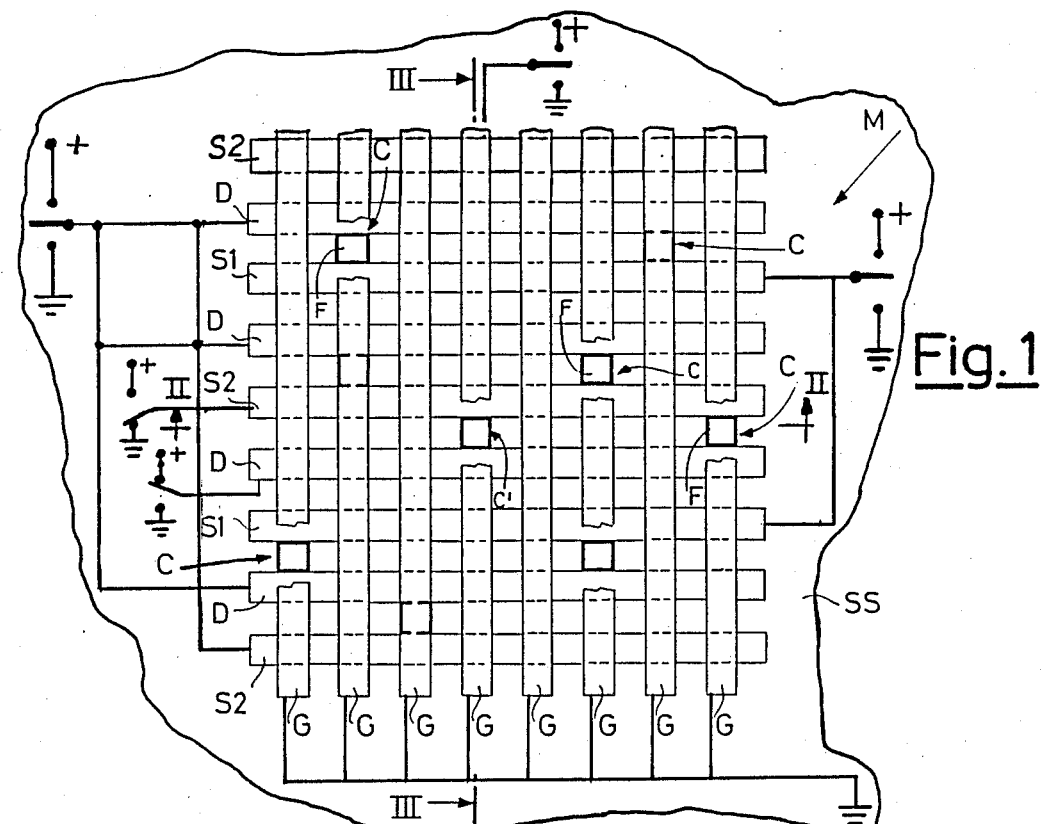
FIG. 1 shows schematically a plan view of the distribution of the source, drain and gate lines in a memory matrix portion according to the invention.
Figure 2:
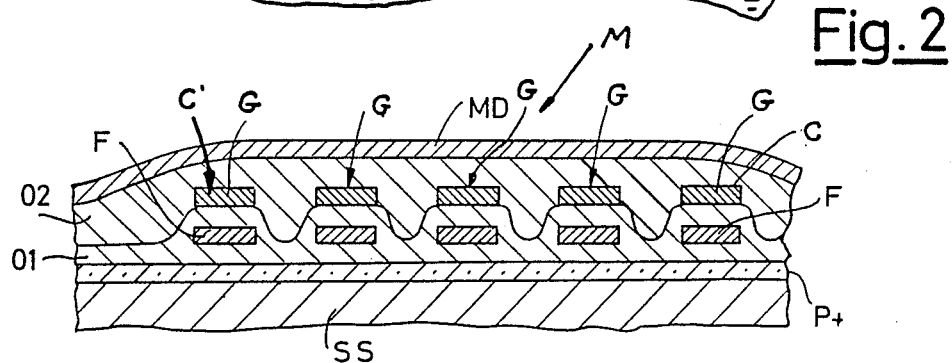
FIG. 2 shows said memory portion in section along plane II—II of FIG. 1, completed with oxide layers and drain metalization lines.
Figure 3:
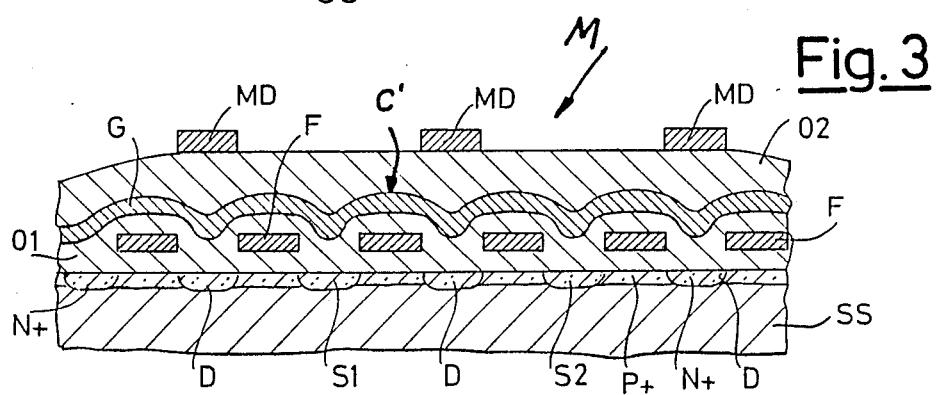
FIG. 3 shows said memory portion in section along plane III—III of FIG. 1, completed with oxide layers and drain metalization lines.

First considering FIGS. 1, 2 and 3, the structure of a memory portion matrix M formed by a plurality of symmetrical elementary MOS cells, each indicated by the reference letter C, is shown therein.

The structure comprises a monocrystalline silicon substrate SS on which two pluralities of parallel source lines S1 and S2 alternating with parallel drain lines D are produced by diffusion of N+ dopant. Said N+ lines are electrically separated by interposed P+ doped areas of the substrate SS.

The unit thus far described is covered by a layer of thermal oxide 01 on which are placed spanning adjacent source and drain lines, floating gate areas F made of polycrystalline silicon. Further thermal oxide 01 also covers said areas F and on said layer are placed and self-aligned with the areas F parallel lines of control gates G made of polycrystalline silicon. A layer of deposited oxide 02 covers the entire described structure, completing a matrix portion of memory cells C, each of which consists basically of a source made up of a line of sources S1 or S2, by a drain made up of a line of drains D, by a floating gate F, and by a control gate G made up of a line of gates G.

The memory matrix comprises in turn a plurality of portions such as the one shown in FIGS. 1-3 placed one beside the other with predetermined spaces therebetween, which are used for contacts, and with metallization lines whose purpose is to limit variations of potential along the source and drain lines due to the high resistivity of the N+ diffusions.

Figure 4:
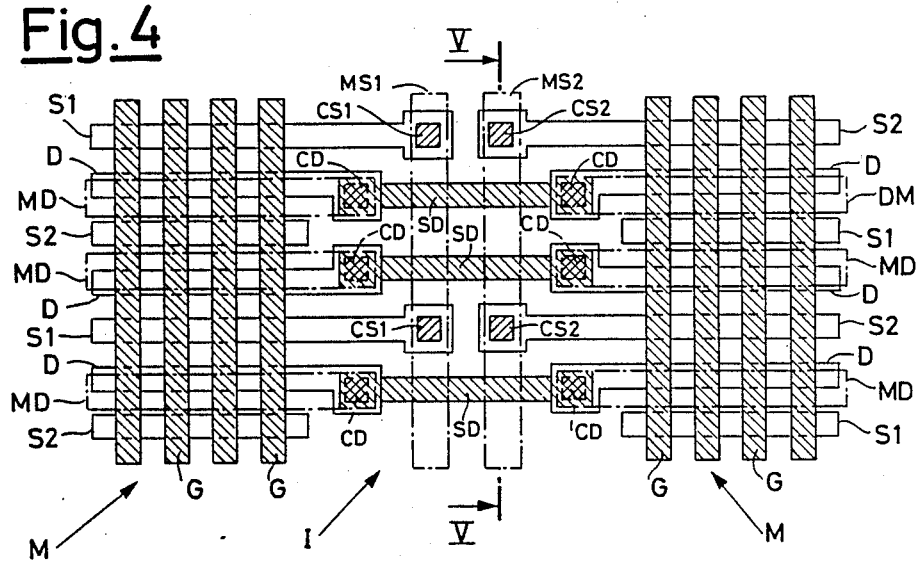
FIG. 4 show schematically a plan view of the distribution of the source, drain and gate lines and of the contact and metallization lines in another portion of the memory matrix corresponding to a space between adjacent portions such as the one shown in FIG. 1.

One of said spaces is illustrated in FIGS. 4 and includes 5 and for the source lines a pair of metallizaton lines MS1 and MS2 arranged parallel to the gate lines G and electrically connected to the source lines S1 and S2 respectively by means of contact areas CS1 and CS2. For the drain lines are provided metallization lines MD superimposed on said drain lines (FIG. 3) and connected electrically thereto with short-circuit functions at contact areas CD included in the aforesaid spaces and connected together by connecting strips SD of polycrystalline silicon or silicide.

Figure 5:
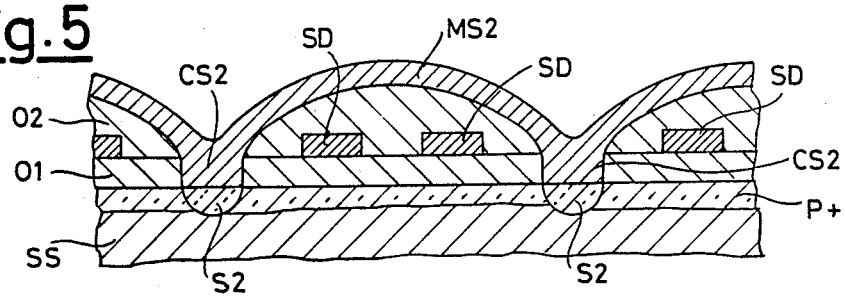
FIG. 5 shows said other memory portion in section along plane V—V of FIG. 4.
Figure 6:
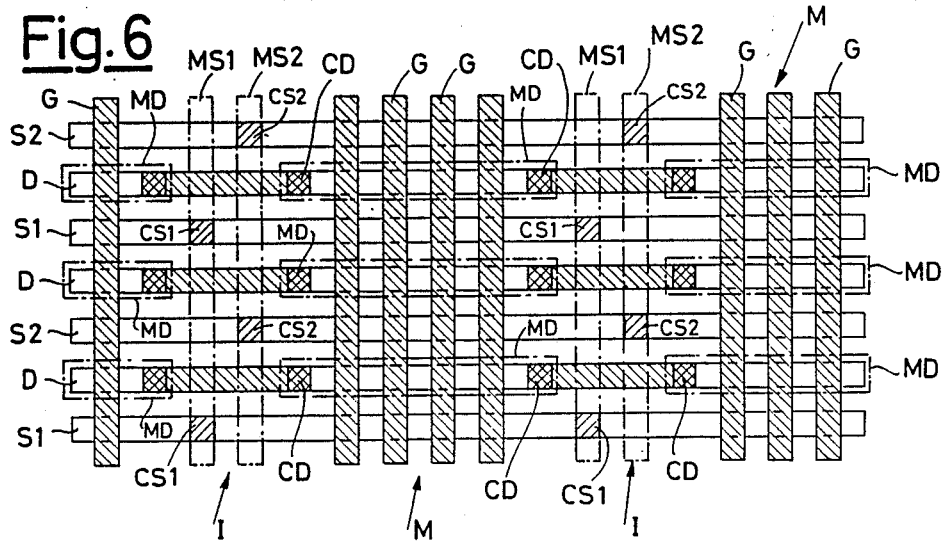
FIG. 6 shows an alternative solution to the distribution shown in FIG. 4.

The solution shown in FIGS. 4 and 5 may be replaced by the one shown in FIG. 6 which provides the formation of self-aligned contacts CS1 and CS2 between the source lines S1 and S2 and the metallization lines MS1 and MS2. With this system the size of the contacts is reduced and the same occurs for the spaces designed for the metallization lines and the contacts themselves. In addition, each source line has a metallization contact at each space I instead of one every two spaces as in FIG. 4 where the lack of space compels leaving without metallization contact either a plurality of source lines of a matrix portion M such as the one shown in FIG. 1 or the other plurality of source lines of the adjacent portion M. The number of gate lines and hence of memory cells between one space and the next may consequently be larger.

Operational use of the memory matrix illustrated in the drawings calls for the following writing method. Assuming that the cell selected for writing is the one indicated by C' in FIG. 1, the corresponding drain line D and the corresponding gate line G are connected to a positive voltage source while all the other drain lines are left floating and all the other gate lines are connected to ground. The corresponding source line S2 is in turn connected to ground together with all the other source lines S2 of the same plurality, which are connected thereto through the metallization lines MS2 (see FIG. 6), while all the source lines S1 of the other plurality, which are interconnected by the metallization line MS1 (see FIG. 6), are left floating. In this manner the selected cell C' has the drain and control gate at a positive potential and the source connected to ground and thus receives the writing. The cells with different gate lines remain in their original state because their control gates are connected to ground. The same occurs for the other cells placed on the same gate line between said drain line corresponding to the cell C' and the nearest source line of the same plurality S2 as the one corresponding to the cell C', this time because three cells are now connected electrically in series and are therefore traversed by a current too weak to bring about writing of the cells traversed. Thus only the selected cell C' is written.

I claim:

1. An EPROM memory matrix with symmetrical elementary MOS cells comprising:
    a silicon substrate;
    two pluralities of parallel source lines, one source line alternating with parallel drain lines formed on said substrate, the source lines of each plurality being electrically connected together;
    floating gate areas spanning said source and drain lines; and
    parallel control gate lines developed perpendicularly to said source and drain lines and superimposed on and self-aligned with said floating gate areas.

2. A memory matrix according to claim 1 wherein said source lines of each plurality are connected together by pairs of metallization lines arranged parallel to the gate lines in predetermined spaces between adjacent groups of gate lines and wherein said drain lines are short-circuited by further metallization lines developing on said drain lines between one of said spaces and the next, metallization contacts between said source and drain lines and said metallization lines being made in said spaces.

3. A memory matrix according to claim 2 wherein said metallization contacts are self-aligned with said source and drain lines and said metallization lines.

4. A method for writing to a memory matrix having two pluralities of parallel source lines alternating with parallel drain lines; and floating gate areas spanning said source and drain lines; and parallel control gate lines developed perpendicularly to said source and drain lines, each plurality of source lines being connected together comprising the steps of:
    connecting the gate line of the selected cell to a positive voltage source;
    connecting the drain line of the selected cell to a positive voltage source; and
    connecting the source line of the selected cell and of all the source lines of the same plurality of source lines to ground.

* * * * *